United States Patent [19]

Fujioka

[11] Patent Number: 5,535,903
[45] Date of Patent: Jul. 16, 1996

[54] METHOD FOR BREAKING CONDUCTING PATH FORMED ON OR IN PRINTED-CIRCUIT BOARD AND LASER SYSTEM FOR USING THE METHOD

[75] Inventor: Mamoru Fujioka, Kawasaki, Japan

[73] Assignee: Fujitsu Limited, Kawasaki, Japan

[21] Appl. No.: 291,897

[22] Filed: Aug. 17, 1994

[30] Foreign Application Priority Data

Mar. 16, 1994 [JP] Japan .................................. 6-046196

[51] Int. Cl.$^6$ .............................. B44C 1/22; H05K 3/22
[52] U.S. Cl. .................... 216/13; 216/94; 216/17
[58] Field of Search .................................. 216/13, 21, 45, 216/65, 94, 17; 156/345, 656.1; 219/121.68, 121.69, 121.85

[56] References Cited

U.S. PATENT DOCUMENTS 5,104,480 4/1992 Wojnarowski et al. ................. 216/65
5,221,426 6/1993 Tessier et al. ............................. 216/65

*Primary Examiner*—William Powell
*Attorney, Agent, or Firm*—Armstrong, Westerman, Hattori, McLeland & Naughton

[57] ABSTRACT

This invention provides a method for breaking a conducting path formed on or in a printed-circuit board. The method comprises steps of arranging a laser source and the printed-circuit board, irradiating a laser beam from the laser source onto a conductive inner wall portion of a through hole in the printed-circuit board so as to remove the conductive inner wall portion of the through hole from the printed-circuit board, and irradiating the laser beam onto a conductive contacting portion where a wiring pattern contacts with a land so as to remove the contacting portion from the printed-circuit board. This invention also relates to a laser system using the method and a printed-circuit board modified by the method.

13 Claims, 18 Drawing Sheets

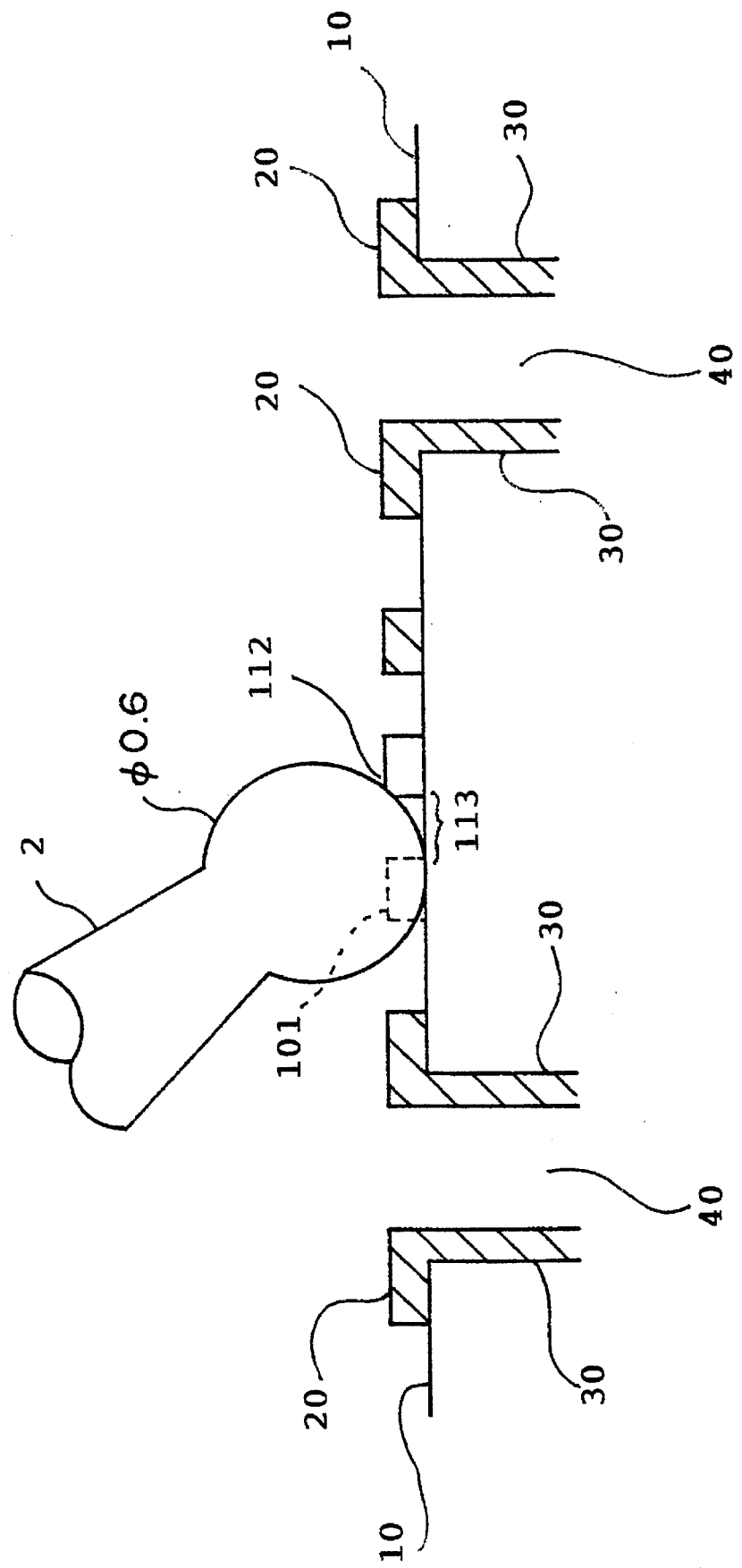

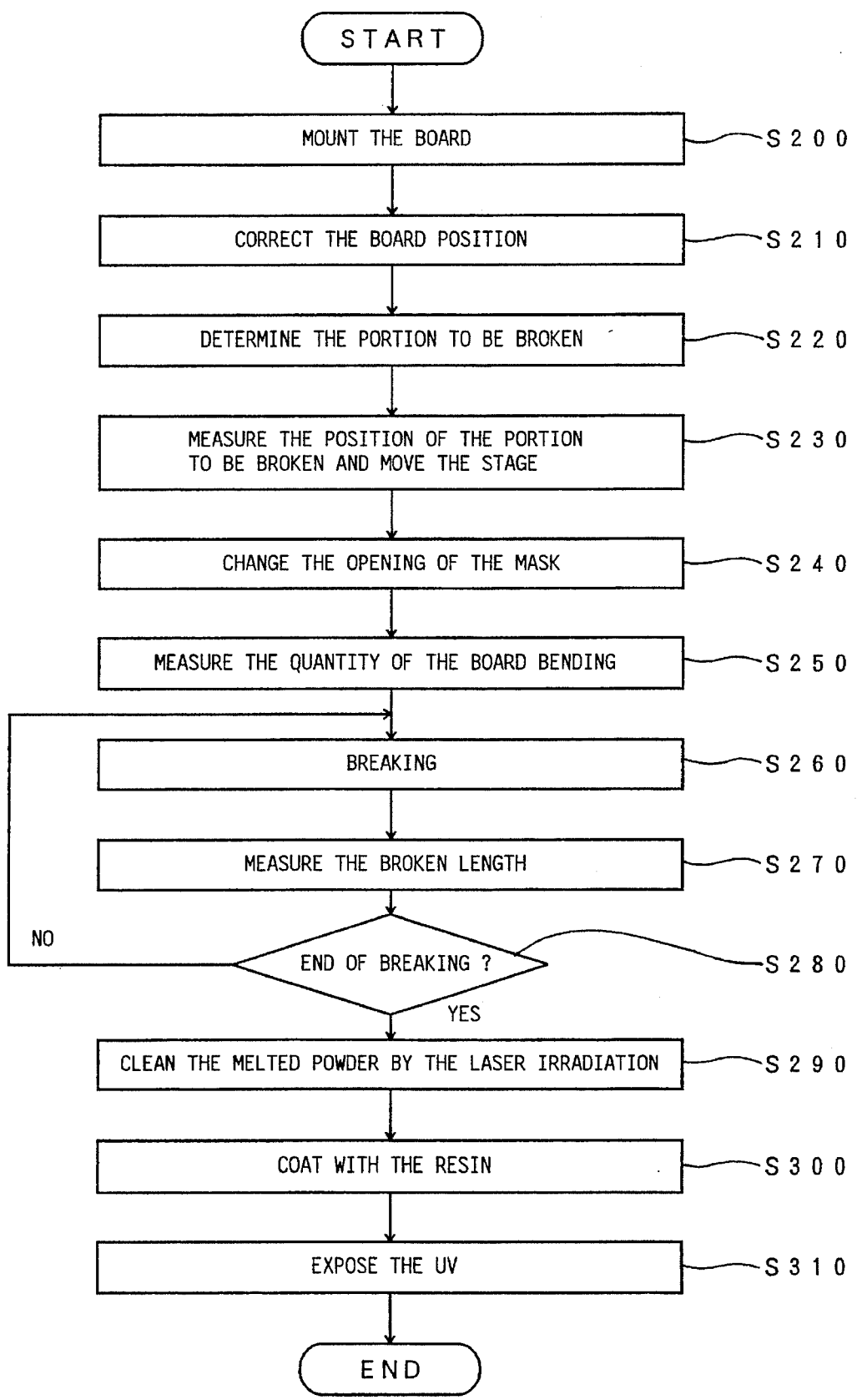

METHOD FOR BREAKING CONDUCTING PATH FORMED ON OR IN PRINTED-CIRCUIT BOARD AND LASER SYSTEM FOR USING THE METHOD

BACKGROUND OF THE INVENTION (1) Field of the Invention

The present invention relates to a method for breaking a conducting path formed on or in a printed-circuit board, and more particularly to a method for breaking a conducting path formed on or in a printed-circuit board, that is highly integrated and multiple-layered, by irradiating a laser beam onto the conducting path. The present invention is also concerned with a laser system using the above method. The present invention also relates to a printed-circuit board modified by the method.

Recently, difficulties in modifying the printed-circuit board such as breaking the conducting path according to design changes has increased as the printed-circuit board is integrated more highly. Therefore, it is required to reduce the difficulties in modifying the printed-circuit board such as breaking the conducting path.

(2) Description of the Prior Art

FIG. 1 shows a conventional method for cutting a wiring pattern 101 on a multiple-layered printed-circuit board 10 with a round bar 2. The round bar 2 is used for cutting wiring patterns by a mechanical process. In this case, the round bar 2 contacts with and cuts the wiring pattern 101. In addition, as shown in FIG. 1, the round bar 2 with a radius φ of 0.6 mm contacts with and damages a wiring pattern 112 adjacent to the wiring pattern 101 spaced with a narrow gap 114 between the wiring pattern 112 and the wiring pattern 101, when the round bar 2 cuts the wiring pattern 101.

FIGS. 2A and 2B show a conventional method in which a wiring pattern 102 located at a surface layer 12 of the printed-circuit board 10 is cut at a point 114 with the conventional round bar 2. A plan view of the wiring pattern 102 to be cut with the round bar 2 is shown in FIG. 2A and a transverse sectional view of the printed-circuit board 10 is shown in FIG. 2B. When another wiring pattern 116, called an internal wiring pattern 116 hereinafter, locates at an internal layer 14 of the printed-circuit board 10 and below the wiring pattern 102, the round bar 2 may contact with and damage the internal wiring pattern 116.

Another exemplary case is shown in FIGS. 3A and 3B in which a wiring pattern 103 located within the internal layer 14 which expands below the surface layer 12 is cut with the round bar 2. A plan view of the wiring pattern 103 to be cut is shown in FIG. 3A and a transverse sectional view of the wiring pattern 103 located within the internal layer 14 is shown in FIG. 3B. In this case, wiring patterns 118 are located at the surface layer 12 and above the wiring pattern 103, as shown in FIG. 3. Therefore the round bar 2 may contact with and damage the wiring patterns 118 at the surface layer 12 when the round bar 2 cuts the wiring pattern 103 within the internal layer 14.

FIGS. 4A through 4D show conventional alternatives to cutting a wiring pattern 104 located below a widely extended conducting layer 120 having a large area, which is present within the multiple-layered printed-circuit board 10, to avoid damaging the widely extended conducting layer 120. The widely extended conducting layer 120 is referred to hereinafter as a "plain" 120. In FIG. 4A, the wiring pattern 104 to be cut is located below the plain 120.

One method for changing the design of the printed-circuit board to prevent the plain 120 from being damaged is shown in FIG. 4B. In this case, the wiring pattern 104 to be cut, which exists below the plain before the design change, as shown in FIG. 4A, can be replaced with a newly formed pattern 122 located above the plain 120. The newly formed pattern 122 is called a "bypassing pattern" hereinafter. The round bar 2 can cut the bypassing pattern 122, without interfering with the plain 120, because the bypassing pattern 122 provides an appropriate portion to be cut above the plain 120. The above-described design change has been used in the conventional method for preventing the plain 120 from being damaged.

In FIGS. 4C and 4D, an escaping pattern 124 for passing through the plain 120 is formed inside of the plain 120. FIG. 4C is a transverse sectional view of the escaping pattern 124 formed within the multiple-layered printed-circuit board 10. A plan view of the plain 120 is shown in FIG. 4D. With the escaping pattern 124, the plain 120 is prevented from being damaged by cutting of the wiring pattern 104 below the plain 120 with the round bar 2, because the round bar 2 can reach the wiring pattern 104 to be cut through the escaping pattern 124 without contacting with the plain 120.

FIG. 5 shows a conductivity tester 4 for checking a conductivity of a conductor such as the wiring pattern 105. As shown in FIG. 5, the conductive wiring pattern 105 is broken at a point 114 on the conductive wiring pattern 105 connecting one land 20A with another land 20B. Two terminals 6A and 6B of the conductive tester 4 are contacted with the lands 20A and 20B, respectively, to check whether the wiring pattern 105 is broken, or cut, with the round bar 2.

However, the following problems may occur in the above-described conventional methods for breaking the conducting path.

A first problem is that the wiring pattern 112 adjacent to the wiring pattern 101 to be cut with the round bar 2, as shown in FIG. 1, could be contacted and damaged with the round bar 2. This is due to the fact that the radius of the round bar 2 does not correspond to the narrow pitch 114 between the wiring patterns 101 and 112 on the highly integrated printed-circuit board 10.

A second problem is that the internal wiring pattern 116 may be damaged by cutting of the surface wiring pattern 102 with the round bar 2, as shown in FIG. 2, when the internal wiring pattern 116 is located below the surface wiring pattern 102 to be cut. When the surface wiring pattern is cut with the round bar 2, it is required to adjust a depth of cutting so as not to damage the internal wiring pattern 116. Furthermore, since clearances between layers, such as the surface layer 12 of the printed-circuit board 10 and the internal layer 14, are becoming smaller as the printed-circuit board 10 is more multiple-layered, it is required to adjust the depth of cutting more precisely.

A third problem is that the narrow pitch 114 between the surface wiring patterns 118 causes the round bar 2 to contact with and damage the surface wiring patterns 118 in cutting the internal wiring pattern 103, as shown in FIG. 3B. As the pitch 114 becomes narrower and narrower in accordance with the highly integrated printed-circuit board 10, it is more difficult to cut only the internal wiring pattern 103 without damaging the surface wiring patterns 118.

A forth problem is that a design change of the printed-circuit board 10, which wastes time and increases costs, is required when the plain 120 is located above the wiring pattern 104 to be cut by the round bar 2, as shown in FIG.

4B. For example, the bypassing wiring pattern 122 is formed on the basis of the design change to break the conducting path on the printed-circuit board 10.

Another example of a design change to prevent the plain 120 from being damaged by the round bar 2 is shown in FIG. 4C. In this case, the escaping pattern 124 is formed within the plain 120, and the round bar 2 passing through the escaping pattern 124 cuts the wiring pattern 104.

In designing a circuit comprised of elements which operate at high speed, signal lines or wiring patterns are desirably located so as to pass above the plain 120 when the printed-circuit board 10 has the plain 120. This arrangement has an advantage that a characteristic impedance matching of the circuit is achieved. However, when the non-conductive escaping pattern 124 is formed within the plain 120 as described above, the signal lines or wiring patterns fail to pass above the conductive plain 120. This causes a fifth problem that the characteristic impedance matching of the circuit is not achieved when the escaping pattern 124 is formed within the plain 120 for preventing the plain 120 from being damaged by the round bar 2.

A sixth problem occurs when the conducting path is broken by cutting the wiring pattern 105 connecting two lands 20A and 20B at the point 114 with the round bar 2. In this case, it is required to find out whether the land 20A conducts to the land 20B to detect whether the conducting path is successfully broken. As is shown in FIG. 5, this checking process, for example, is executed with aid of the conductivity tester 4. In use of the conductivity tester 4, it is required to find positions of the lands 20A and 20B, and also contact the lands 20A and 20B with the terminals 6A and 6B, respectively. Such a testing process requires elaborate and time-consuming work.

Furthermore, in the conventional methods described above for breaking the conducting path by cutting the wiring pattern with the round bar 2, a visual inspection based on a comparison between a drawing of the printed-circuit board and an actual multiple-layered printed-circuit board 10 is required to find the wiring pattern to be cut. It is a seventh problem that the visual inspection is not an efficient method finding any type of wiring pattern. For example, the conducting path is often covered with a layer such as a resist layer, and thus, it takes much time to find an appropriate portion to be cut. In addition, if the wiring pattern to be cut was present in the internal layer of the multi-layered printed-circuit board 10, it is more difficult to find the wiring pattern to be cut.

SUMMARY OF THE INVENTION

Accordingly, it is a general object of the present invention to provide a novel and useful method for breaking a conducting path formed on or in a printed-circuit board precisely and rapidly without cutting a wiring pattern with a round bar in which the above-described problems are eliminated. It is also an object of the present invention to provide a novel and useful laser system using the above-mentioned method.

The above-mentioned objects of the present invention are achieved by a method for breaking a conducting path formed on or in the printed-circuit board which comprises steps of arranging a laser source and the printed-circuit board and irradiating a laser beam from the laser source onto an inner wall portion of a through hole provided in the printed-circuit board and attached with a conductor so as to remove the conductive inner wall portion from the through hole in the printed-circuit board, wherein the inner wall portion inside of the through hole is a part of said conducting path, and a laser system using the method.

The method for breaking the conducting path formed on or in the printed-circuit board further comprises a step of irradiating the laser beam onto a contacting portion formed from a part of a wiring pattern and a part of a land around an opening of a through hole in the printed-circuit board so as to remove the contacting portion from the printed-circuit board, wherein the wiring pattern and the land are part of the conducting path.

The system using the above method for breaking the conducting path formed on or in the printed-circuit board comprises a laser source for generating a laser beam, a lens for converging the laser beam generated by the laser source, and a stage for mounting the printed-circuit board, wherein the laser is irradiated onto the wiring pattern on the printed-circuit board through the lens. The system further comprises a mask having an opening for accommodating the laser beam according to a shape of the conducting path to be broken.

According to the method of the present invention, the laser beam is irradiated onto prescribed portions in the conducting path formed on or in the printed-circuit board so as to remove the inner wall portion of the through hole or the contacting portion connecting the wiring pattern with the associated land, rather than by cutting the wiring pattern with the round bar. Thus, a pattern adjacent to the wiring pattern to be broken is prevented from being damaged under geometrical conditions. And also the through hole or the land is more detectable in both a drawing of the printed-circuit board and the actual printed-circuit board than the wiring pattern. Therefore, this may reduce the difficulty in finding the portion to be broken and inspecting whether the portion has been adequately broken, and may result in saving time. Furthermore, as the difficulty in finding the portion is reduced, an accuracy in positioning the printed-circuit board or positioning the portion of the printed-circuit board to be processed is improved. Thus, the conducting path formed on the printed-circuit board can be broken more precisely and faster, and the inspection of the portion having been processed can be executed more readily.

Further, in the method according to the present invention, the whole inner wall portion of the through hole in the printed-circuit board can be removed from the through hole. Therefore, the conducting path formed in the multiple-layered printed-circuit board can be broken without the surface wiring pattern being damaged, and a design change for the printed-circuit board is not required.

Furthermore, according to the system for breaking the conducting path formed on or in the printed-circuit board of the present invention, the opening of the mask to adjust the laser beam irradiated onto the printed-circuit board is defined dependently on the shape of the portion of the conducting path to be broken. Therefore, the laser beam is irradiated onto the desired area excluding an unwanted portion by means of the opening of the mask, and thus the unwanted portion of the printed-circuit board can be protected against the laser irradiation.

The present invention also provides a printed-circuit board comprising at least one conducting path formed therein or thereon, characterized in that the one conducting path is broken by irradiating a laser beam onto a part of the one conducting path so as to remove the part of the conducting path therefrom.

BRIEF DESCRIPTION OF THE DRAWINGS

The above and other objects, features, and advantages of the present invention will be more apparent from the following detailed description when read in conjunction with the accompanying drawings, in which:

FIG. 1 is a side view showing a conventional method for cutting a wiring pattern on a printed-circuit board;

FIG. 12 is a flow chart for explaining the principle of a method for breaking the conducting path in a third embodiment according to the present invention;

DESCRIPTION OF THE PREFERRED EMBODIMENTS

A description will now be given, with reference to FIGS. 6 and 7, of the principle of a method for breaking a conducting path formed on or in a printed-circuit board by arranging a laser source and the printed-circuit board and irradiating a laser beam from the laser source onto at least a part of the conducting path so as to remove the part from the printed-circuit board according to the present invention.

Figure 2A:
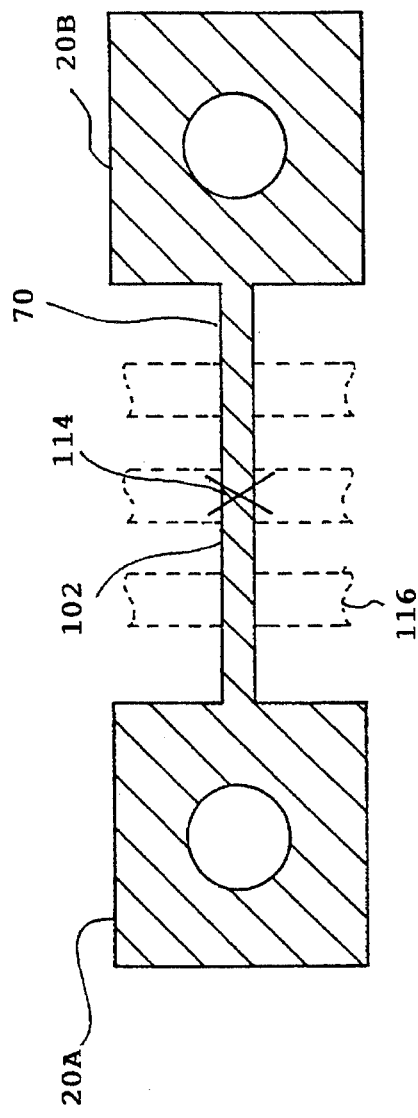
FIG. 2A is a plan view showing a conventional method for cutting a surface wiring pattern and FIG. 2B is a transverse sectional view showing the method.
Figure 2B:
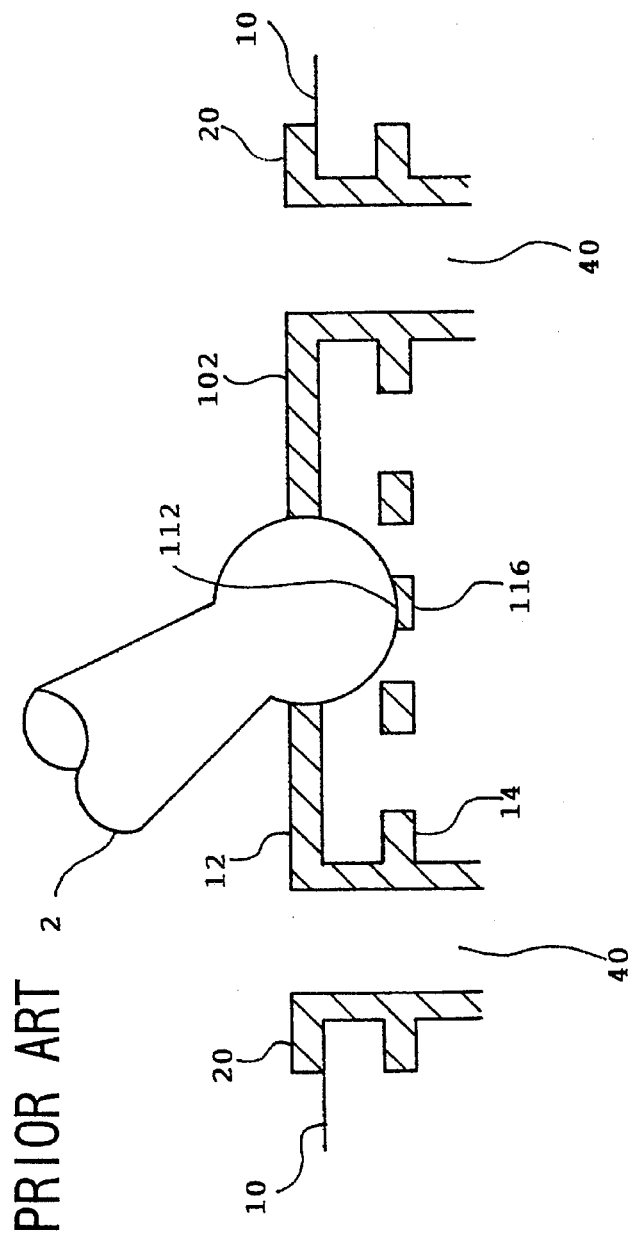
Figure 3A:
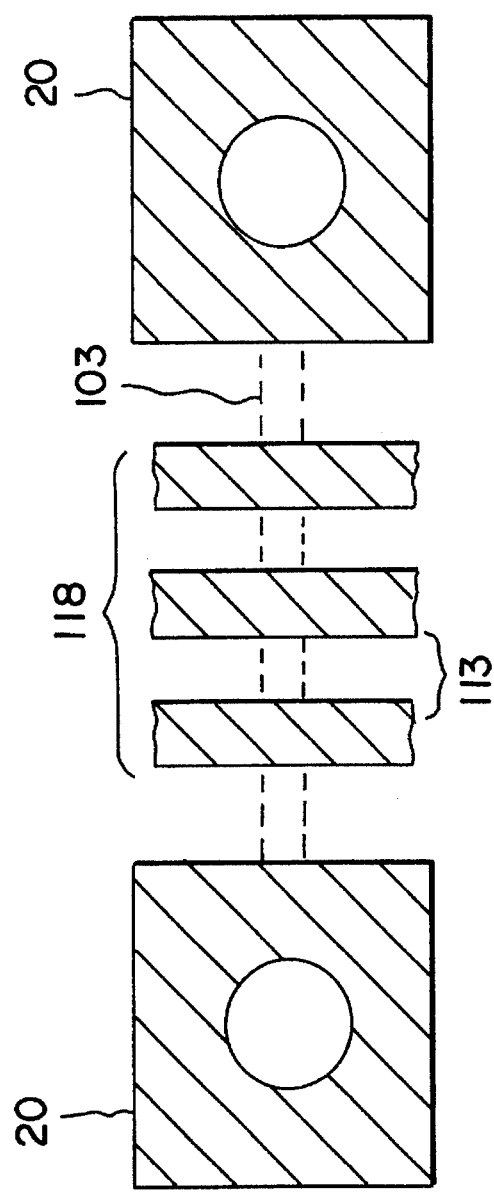
FIG. 3A is a plan view showing a conventional method for cutting a wiring pattern within an internal layer of the printed-circuit board and FIG. 3B is a transverse sectional view showing the method.
Figure 3B:
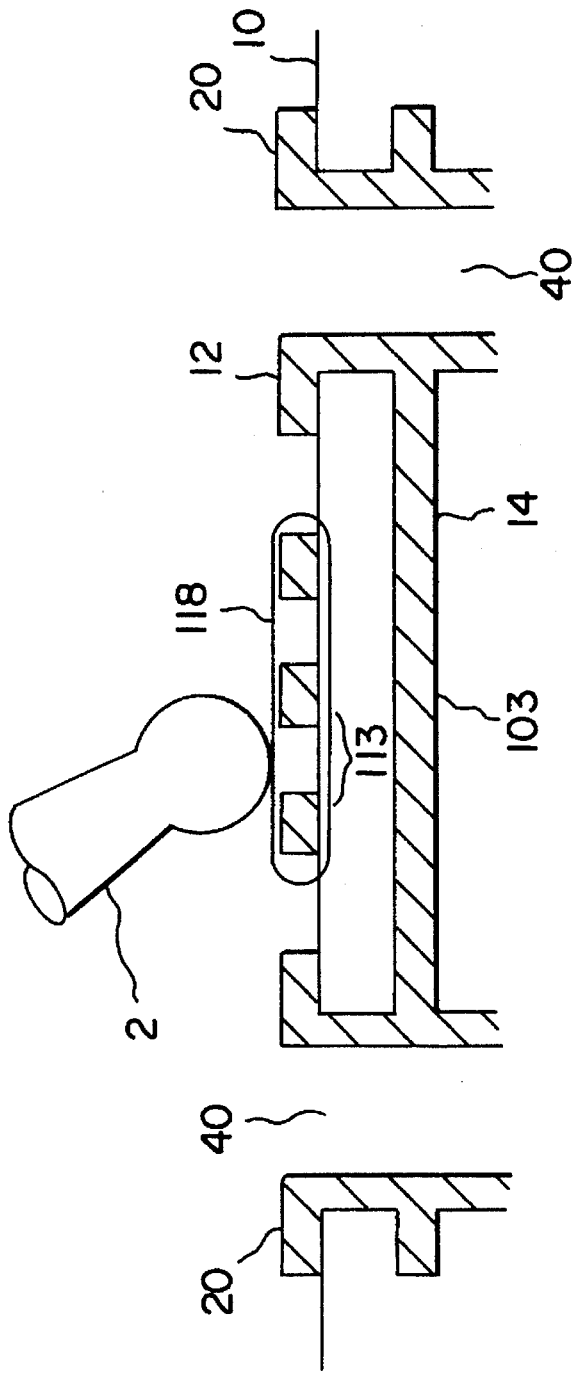
Figure 4A:
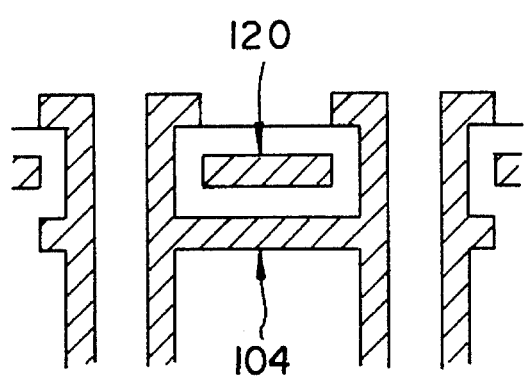
FIG. 4A is a transverse sectional view showing a plain preventing one wiring pattern below the plain from being cut.
Figure 4B:
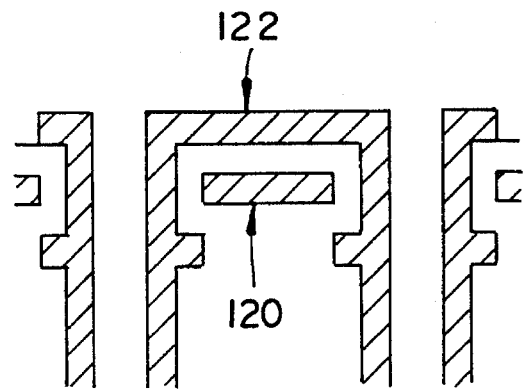
FIG. 4B is a transverse sectional view showing a conventional method for cutting not the wiring pattern but another wiring pattern bypassing the plain.
Figure 4C:
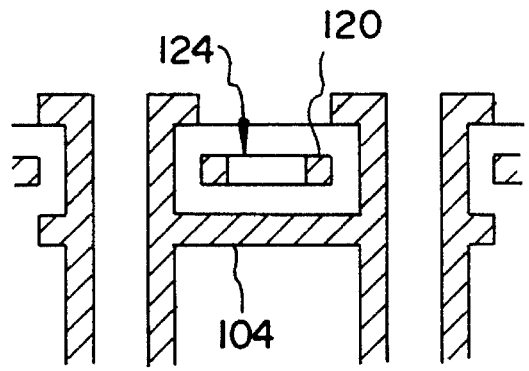
FIG. 4C is a transverse sectional view showing a conventional method for cutting the wiring pattern below the plain by forming an escaping pattern within the plain.
Figure 4D:
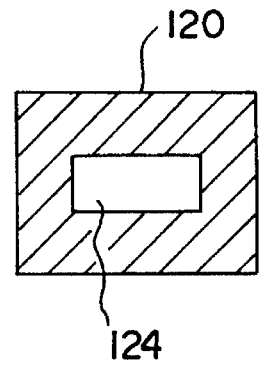
FIG. 4D is a plan view showing the plain in which the escaping pattern is formed.
Figure 5:
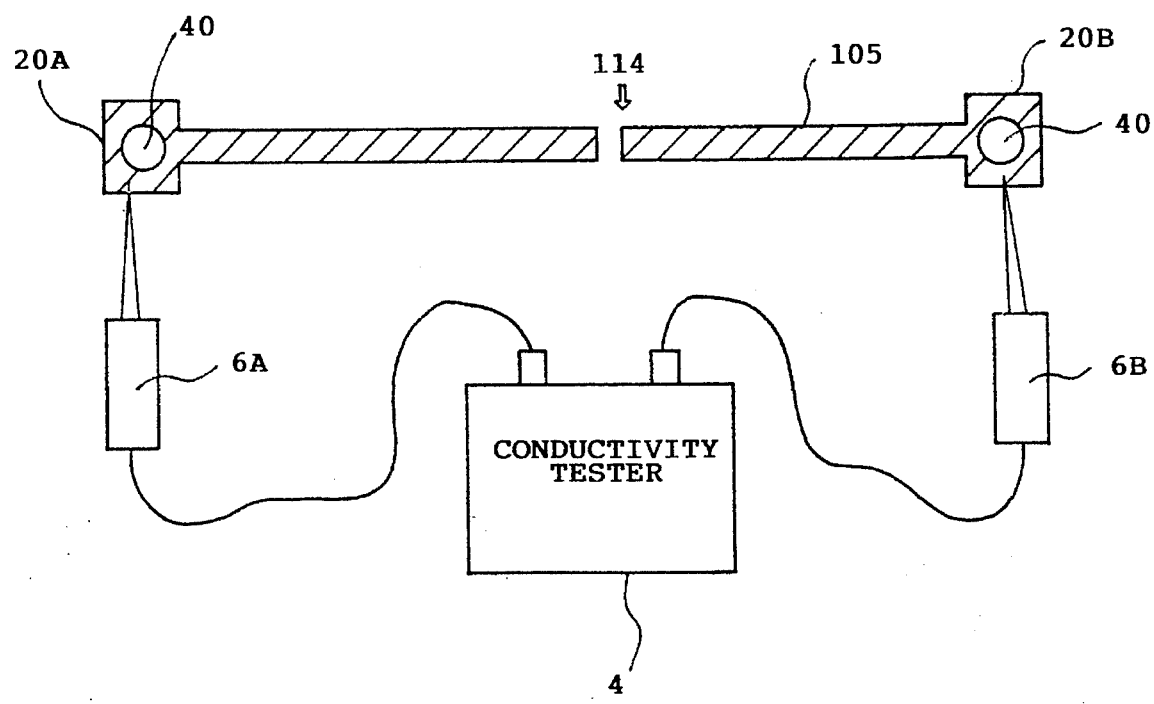
FIG. 5 is a schematic illustration showing a conventional tester for checking a conductivity of a conducting path such as a wiring pattern.
Figure 6:
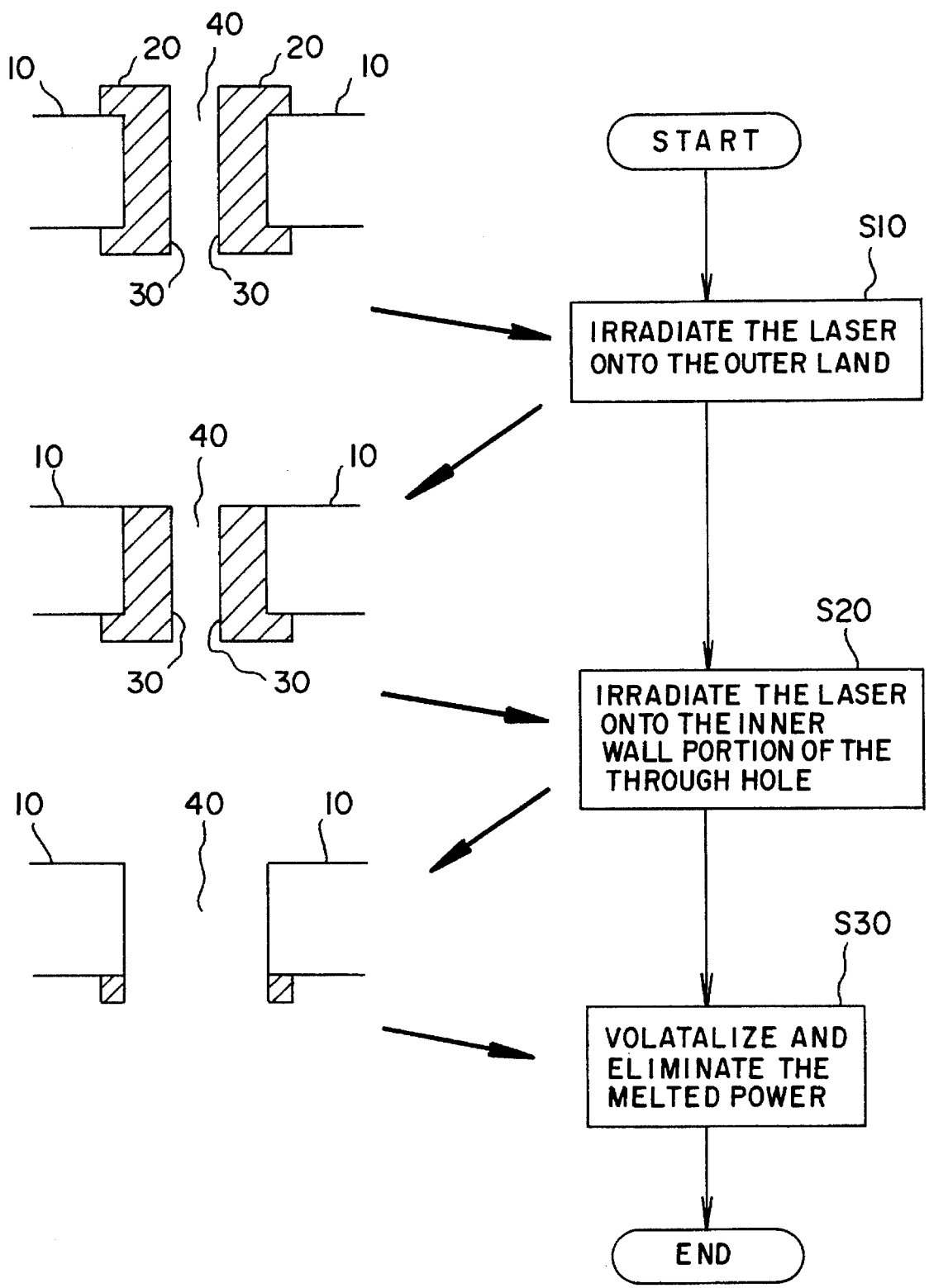
FIG. 6 is a flow chart for explaining the principle of a method for breaking a conducting path formed on or in the printed-circuit board by removing an inner wall portion of a through hole from the printed-circuit board according to the present invention.

In FIG. 6, the conducting path is formed of an inner wall portion 30 of a through hole 40 and an outer land 20 around the through hole 40 on a printed-circuit board 10. As shown in FIG. 6, according to the method of the present invention for breaking the conducting path formed on or in the printed-circuit board 10, first, a laser source and the printed-circuit board 10 is arranged and the laser beam from the laser source is irradiated onto the outer land 20 on the printed-circuit board 10 so as to remove the outer land 20 from the printed-circuit board 10 in step S10. The laser beam is used for melting and volatilizing a conductive portion or the part of the conducting path. After the outer land 20 has been removed from the printed-circuit board 10, the laser beam is irradiated onto the inner wall portion 30 of the through hole 40 so as to remove inner wall portion 30 from the through hole 40 in step S20. After the conductive portion has been volatilized, a melted powder of the conductive part may remain at and around a region onto which the laser beam has been irradiated. Consequently, in step S30, the aperture of the laser beam is enlarged and the laser beam is irradiated onto the region where the melted powder remains so as to volatilize and eliminate the melted powder from the printed-circuit board 10.

Figure 7:
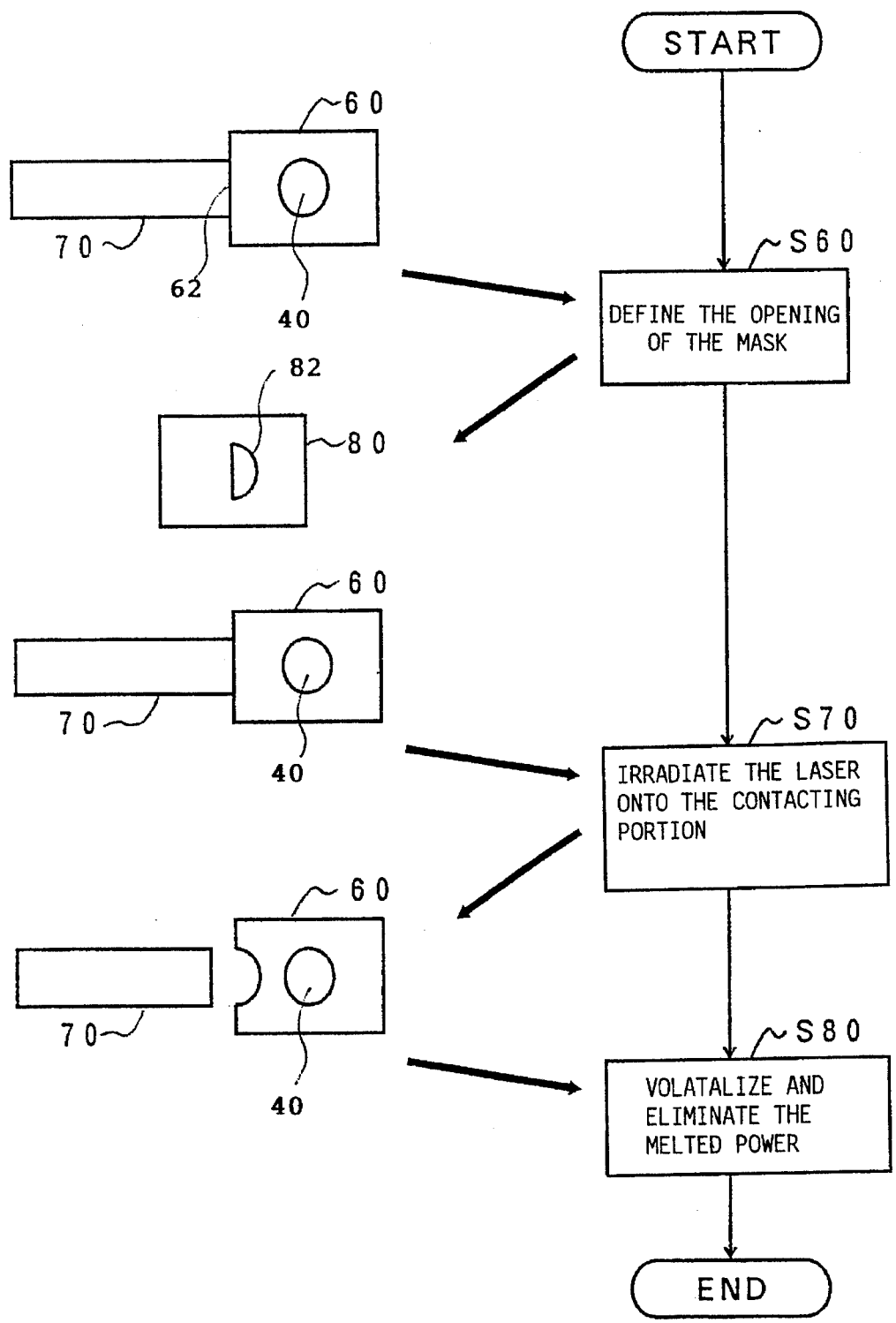
FIG. 7 is a flow chart for explaining the principle of a method for breaking the conducting path formed on or in the printed-circuit board by removing a land pattern from the printed-circuit board according to the present invention.

In FIG. 7, the conducting path is formed of a land 60 around the through hole 40 and a wiring pattern 70 on the printed-circuit board 10. As shown in FIG. 7, according to the method of the present invention for breaking the conducting path formed on or in the printed-circuit board, a mask 80, for masking some areas on the printed-circuit board 10 so as not to be irradiated with the laser beam, is used. The mask 80 has an opening 82 to determine a region onto which the laser beam is irradiated. A process for breaking the conducting path starts with defining a shape of the opening 82 of the mask 80 in step S60. For example, the shape of the opening 82 of the mask may be defined such that the laser beam can be irradiated onto a region 62 where the land 60 contacts with the wiring pattern 70, or where the wiring pattern 70 projects. The region 62 is hereinafter referred to a "contacting portion." Next, the laser beam is irradiated on the contacting portion 62 so as to remove a conductive portion from the conducting path on the printed-circuit board 10. Now, it may be said that the land 60 has been broken. After the conductive portion has been volatilized, a melted powder of the conductive part may remain at and around the contacting portion 62 onto which the laser beam has been irradiated. Consequently, in step S80, the aperture of the laser beam is enlarged and the laser beam is irradiated at and around the contacting portion 62 where the melted powder remains so as to volatilize and eliminate the melted powder from the printed-circuit board 10.

According to the method described above, the laser beam is irradiated onto prescribed portions in the conducting path formed on or in the printed-circuit board so as to remove the inner wall portion 30 of the through hole 40 or the contacting portion 62 connecting the wiring pattern 70 with the associated land 60, rather than by cutting, for example, the wiring pattern 70 with the round bar 2. Thus, a pattern adjacent to the wiring pattern 70 to be broken is prevented from being damaged under geometrical conditions. And also the through hole 40 or the land 60 is more detectable in both a drawing of the printed-circuit board and the actual printed-circuit board than the wiring pattern 70. Therefore, the method of the present invention may reduce difficulty in finding the portion to be broken and inspecting whether the portion has been adequately broken, and may result in saving time. Furthermore, as the difficulty in finding the portion is reduced, an accuracy in positioning the printed-circuit board 10 or positioning the portion of the printed-circuit board 10 to be broken is improved. Thus, the conducting path formed on or in the printed-circuit board 10 can be broken more precisely and faster, and the inspection of the portion having been processed can be executed more readily.

Further, in the method according to the present invention, the whole inner wall portion 30 of the through hole 40 in the printed-circuit board 10 can be removed from the through hole 40. Since the conducting path located in an inner layer of the multiple-layered printed-circuit board 10 often conducts to the inner wall portion 30 of the through hole 40, the conducting path formed in the multiple-layered printed-circuit board 10 can be broken by removing the inner wall portion 30 of the through hole 40. Therefore, the surface wiring pattern is not damaged, nor is a design change for the printed-circuit board required when the conducting path located in the inner layer should be broken.

Figure 8:
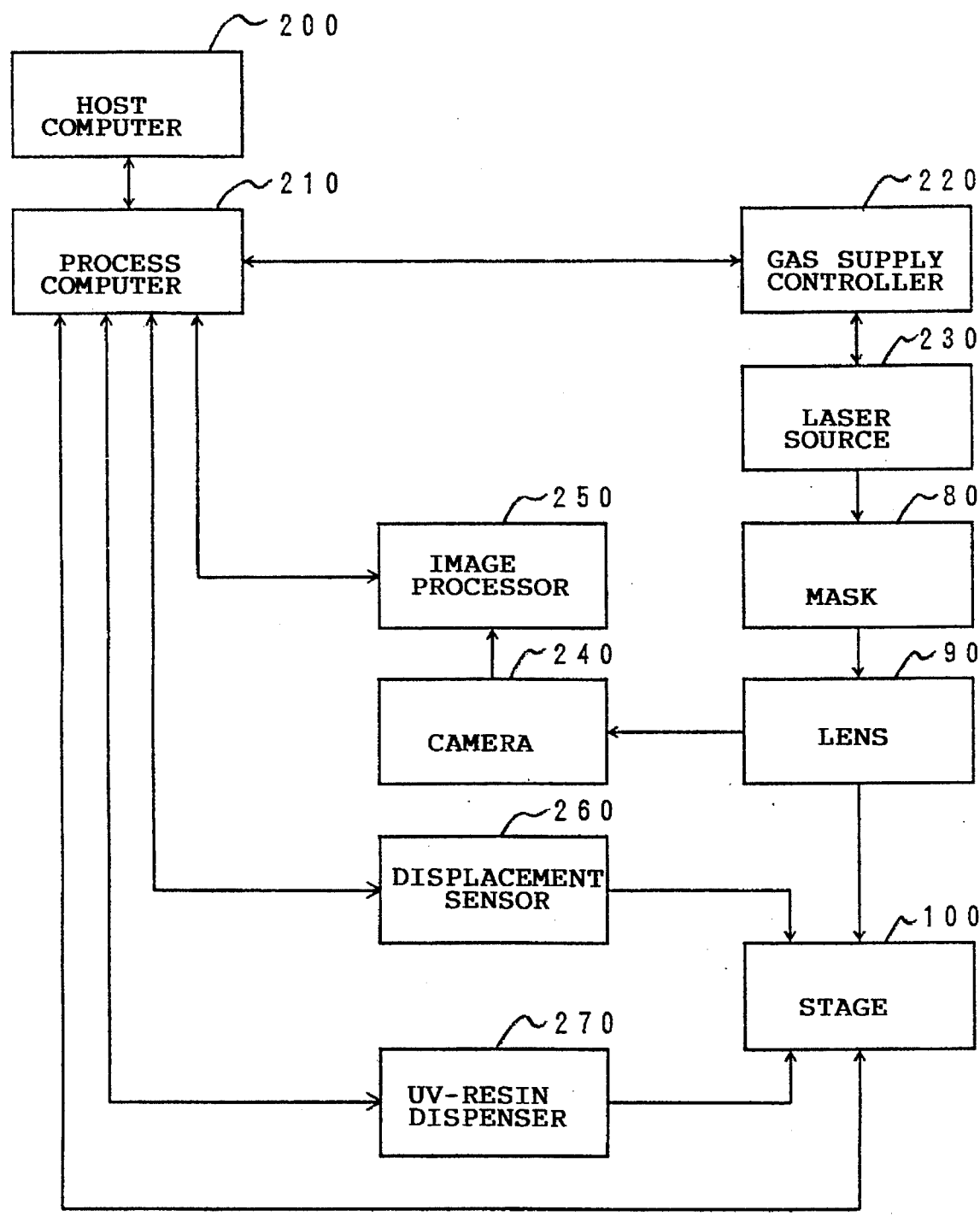
FIG. 8 is a block diagram showing a first embodiment of a laser system for breaking the conducting path according to the present invention.

Next a description will be given, with reference to FIG. 8, of a laser system for breaking a conducting path according to a first embodiment of the present invention. In FIG. 8, the laser system comprises a host computer 200 for generating data used for processing and storing the data, a process computer 210 for controlling a breaking process.

Also the laser system comprises a laser beam source 230 for generating, for example, an excimer laser beam to be irradiated onto the conducting path on the printed-circuit board 10 and a gas supply controller 220 for supplying rare gases and an impressed voltage related to an output power of the excimer laser beam to the laser source 230 and monitoring the output power of the excimer laser beam from the laser source 230.

The host computer 200 is connected to the process computer 210 and sends the data to the process computer 210. The process computer 210 connected to the host computer 200 receives the data for processing from the host computer 200 and controls the process according to the received data. The process computer 210 is also connected to the gas supply controller 220.

The laser system further comprises an optics system, including a mask 80, a lens 90, and a stage 100, for converging the laser beam on the conducting path formed on or in the printed-circuit board 10.

The laser system further comprises a sensor system, including a camera 240 and an image processor 250, for detecting a position of the conducting path to be broken with the laser beam and inspecting the broken conducting path, and a displacement sensor 260 for measuring a displacement of the printed-circuit board 10 caused by the irradiation of the laser beam. The laser system also has a UV-resin dispenser 270 for coating the printed-circuit board 10 with a resin.

The process computer 210 is also connected to the image processor 250, the displacement sensor 260, the UV-resin dispenser 270, and the stage 100 in order to control the process for breaking the conducting path.

The laser system will be described in detail hereinafter.

The laser source 230, for example, generates the excimer laser beam having a wavelength of 248 nm, an average output power of 50 W, an energy pulse of 250 mJ, a repeatable irradiation number of 200 pps, a pulse width of 16 ns, and a beam width of 8×25 mm.

The process computer 210 directs a command to the gas supply controller 220 in order to adjust a quantity of the rare gases supplied to the laser source 230. Features of the excimer laser beam, such as the wavelength, the average output power, and the energy pulse must be modified depending on usages of the excimer laser. For example, the excimer laser used for melting a conducting path and the excimer laser used for volatizing a melted powder require different output power. Therefore, the features of the excimer laser are modified according to the command given by the process computer 210.

It is necessary to maintain the output power of the excimer laser irradiated onto the conducting path formed on or in the printed-circuit board 10, particularly, during a process for melting the conducting path. Thus, when the process computer 210 receives a report from the gas supply controller for monitoring the output power of the laser that the output power of the laser has reduced, the process computer 210 directs a command to modify the quantity of the gases to the gas supply controller 220 in order to hold the output power of the laser within a prescribed range.

For example, when the output power of the laser decreases below the prescribed range, the gas supply controller 220 increases the impressed voltage to increase the output power of the laser. Further, the gas supply controller 220 supplies, for example, halogen gas to the laser source 230 in order to increase the output power of the laser when the output power of the laser is restricted by a maximum value of the increased voltage.

The mask 80 is used for masking some areas on the printed-circuit board 10 so as not to be irradiated with the laser beam. The mask 80 has the opening 82 to determine the region onto which the laser beam is irradiated, as described above. The shape of the opening 82 of the mask 80 is defined in accordance with the shape of a conducting portion to be broken on the printed-circuit board 10.

The shape of the opening 82 of the mask 80 is required to be defined so that the resin used for coating the the printed-circuit board 10 should be protected against the laser beam irradiation. Therefore, it is desirable that the size of the opening 82 of the mask 80 be as small as possible to reduce an area from which the resin is removed with the laser beam irradiation. The opening 82 of the mask 80 may be rectangularly, circularly, or semicircularly shaped on a basis of the shape of the conducting portion to be broken as well as the area from which the resin is removed. In a typical case, Mo may be used as a material of the mask 80 to shield the laser beam.

The printed-circuit board 10 is mounted on a movable stage 100 for locating the printed-circuit board 10 at an appropriate position to be irradiated with the laser beam. The movement of the stage 100 is directed by the process computer 210. The process computer 210 determines the movement of the stage 100 on a basis of the data for processing received from the host computer 200 and data concerning the position of the conducting path to be broken from the image processor 250 and the displacement sensor 260.

Though the laser beam has an irradiation area to be limited, the laser beam is converged on the conducting path formed on or in the printed-circuit board 10 mounted on the stage 100 with the optics system including the lens 90, the mask 80, and the stage 100. The stage 100 can be moved to be located in the position specified by the above-mentioned data from the process computer 210.

In the laser system the camera 240 is used for taking images of several portions on the printed-circuit board 10 mounted on the stage 100 such as a positioning mark, a conductive portion in the conducting path and a broken portion in the conducting path. The camera 240 is directed to take the images via the lens 90 by the image processor 250 connected thereto. The image processor 250 receives such images from the camera 240 and executes various image processing functions. The image processor 250 is connected to the process computer 210 for controlling the image processor 250. The image processing functions include a conversion of the image into a bi-level (binary) image, general image processing operations including an arithmetic conversion of the image, and special purpose image processing operations.

The process for irradiating the laser beam onto the printed-circuit board 10 causes the printed-circuit board 10 to be bent locally because the power density of the laser may vary at each point on the printed-circuit board 10. Therefore, according to the first embodiment of the present invention, the laser system for breaking the conducting path formed on or in the printed-circuit board 10 includes the displacement sensor 260 for measuring the displacement of the printed-circuit board 10 caused by the laser beam irradiation. The displacement sensor 260 is connected to and controlled by the process computer 210. The process computer 210 sends a command to the displacement sensor 260. Then the displacement sensor 260 measures a quantity of the bending of the printed-circuit board 10 and reports a measured value to the process computer 210. Then the process computer 210 receives the measured value from the displacement sensor 260 and determines a position of the stage 100 along a z-axis in accordance with the received value. The z-axis has the same direction as the direction of the laser beam irradiation. The process computer 210 directs the stage 100 to move to the determined position.

The UV-resin dispenser 270 is connected to the process computer 210 and is used for coating with the resin a region where the laser beam has been irradiated. Because of the laser beam irradiation onto the region where the conductive portion has been broken, the resin used for coating the region has been removed from the printed-circuit board 10. Thus, it is desirable that the region be again coated with the resin. The UV-resin dispenser 270, first, coats the region with the resin, and then exposes UV onto the region in order to harden the resin.

Figure 9:
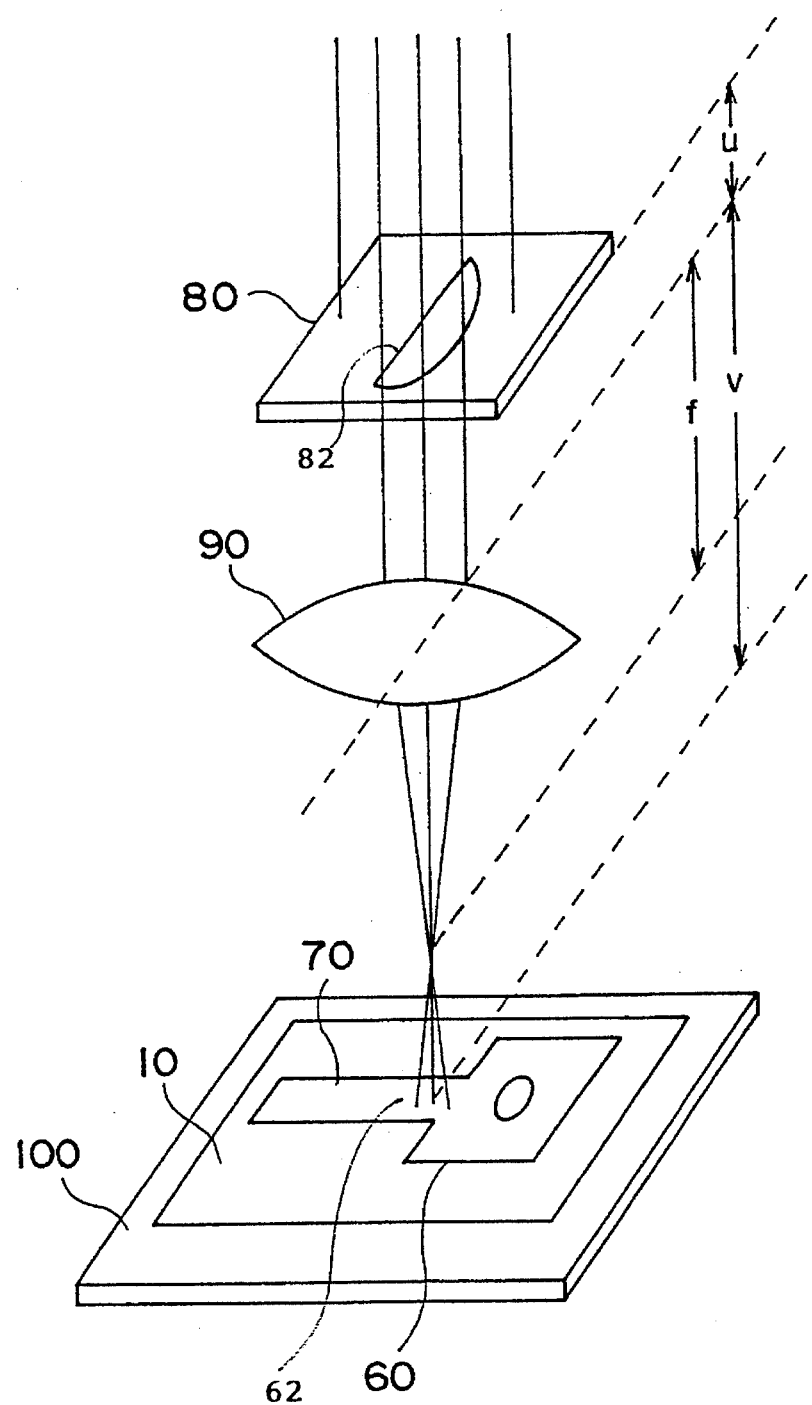
FIG. 9 is a schematic perspective view for explaining optics of the first embodiment of the laser system for breaking the conducting path according to the present invention.

Next a description will be given, with reference to FIG. 9, of the optics system of the first embodiment of the present invention. In FIG. 9, the optics system comprises the mask 80, the lens 90 and the movable stage 100. The laser beam passing through the opening 82 of the mask 80 is limited as to the laser beam width and is then converged by the lens 90 so as to be irradiated onto the wiring pattern 70 and the land 60 on the printed-circuit board 10 mounted on the stage 100. The mask 80, the lens 90 and the stage 100 are arranged so that the following equation is satisfied:

$$1/u + 1/v = 1/f \quad (1)$$

where u is a distance between the mask 80 and the center of the lens 90, v is a distance between the center of the lens 90 and the printed-circuit board 10 mounted on the stage 100, and f is a focal length of the lens 90. The optics system represented by the above equation (1) causes a projection of the opening 82 of the mask 80 onto the printed-circuit board 10 to be reduced at a reduction rate m, wherein m is expressed as follows:

$$m = u/v$$

where u and v are the same as described above.

The shape of the opening 82 of the mask 80, as shown in FIG. 9, is suitable for breaking the contacting portion 62 connecting the wiring pattern 70 to the land 60.

Figure 10:
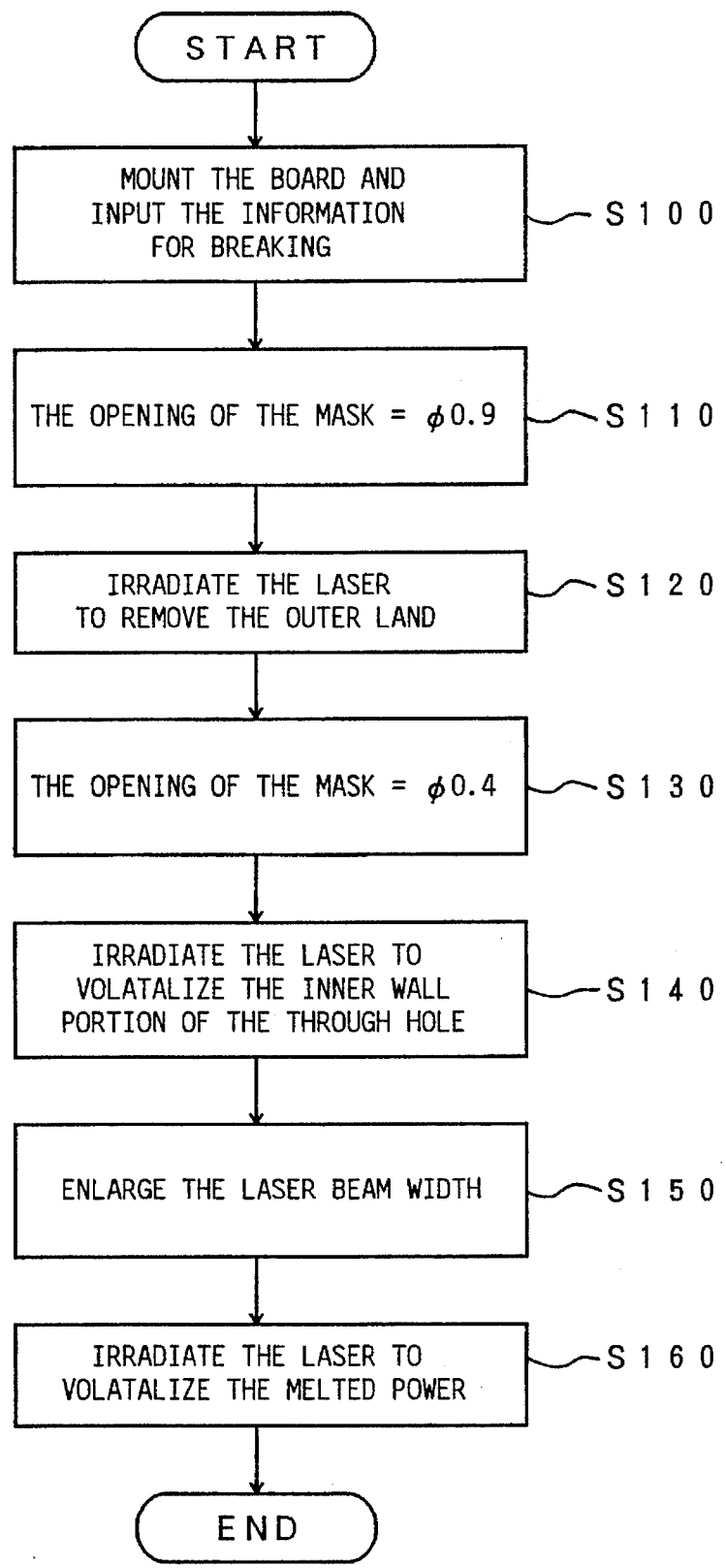
FIG. 10 is a flow chart for explaining the principle of a method for breaking the conducting path in a second embodiment according to the present invention.

Next a description will be given, with reference to FIGS. 10 and 11, of a general operation of a laser system for breaking a conducting path 130 by irradiating the laser beam onto a through hole according to a second embodiment of the present invention. A flow chart of the operation of the laser system is shown in FIG. 10. And FIGS. 11A, 11B and 11C show transverse sectional views of the printed-circuit board 10 for explaining the breaking of the conducting path, connecting point A to point B, formed in the printed-circuit board 10.

First, a multiple-layered, 8 to 12 layers for example, printed-circuit board 10 is mounted on the stage 100 in the laser system. In step S100, process information such as a radius of the outer land 20 ($\phi=0.7$ mm), an average thickness of the outer land 20 (25 μm), an average thickness of the inner wall portion 30 of the through hole 40 (25 μm), a radius of the through hole 40 ($\phi=0.4$ mm), a depth of the through hole 40 (1.6 mm), and so forth, are input to the process computer 210.

Next, in step S110, the size of the opening 82 of the mask 80 is defined as to be $\phi=0.9$ mm, so that the laser beam is irradiated onto only the outer land 20 to be removed. It is desirable that the opening 82 be defined larger than the radius of the outer land 20 ($\phi=0.7$ mm) and otherwise as small as possible so as not to damage a resin used for coating the printed-circuit board 10.

Figure 11A:
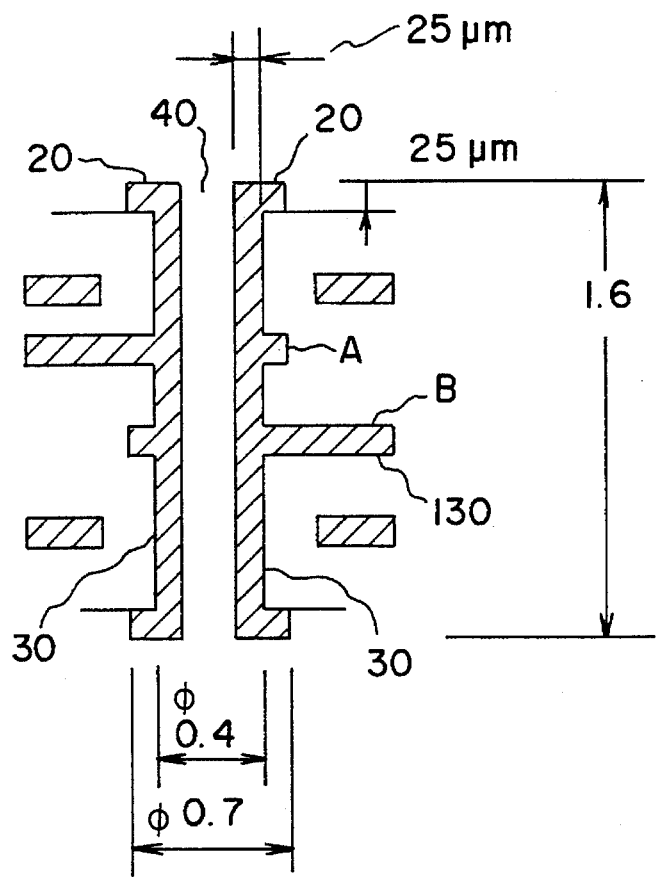
FIGS. 11A, 11B and 11C respectively are transverse sectional views explaining a process for breaking the conducting path in the second embodiment according to the present invention.

In step S120, the laser having a prescribed number, such as 500, of pulses is generated by the laser source 230, and is irradiated, via the mask 80 and lens 90, onto the outer land 20 around the through hole 40, as shown in FIG. 11A. This laser beam irradiation onto the outer land 20 causes the outer land 20 around the through hole 40 to be melted and volatilized. Thus, the outer land 20 is removed from the printed-circuit board 10 and the laser beam irradiation on the printed-circuit board 10 ends.

In step S130, the size of the opening 82 of the mask 80 is defined as, for example, $\phi=0.4$ mm, so that the laser beam is irradiated onto only the inner wall portion 30 to be removed from the through hole 40. It is desirable that the opening 82 of the mask 80 be defined as large as the radius of the through hole 40 ($\phi=0.4$ mm).

Figure 11B:
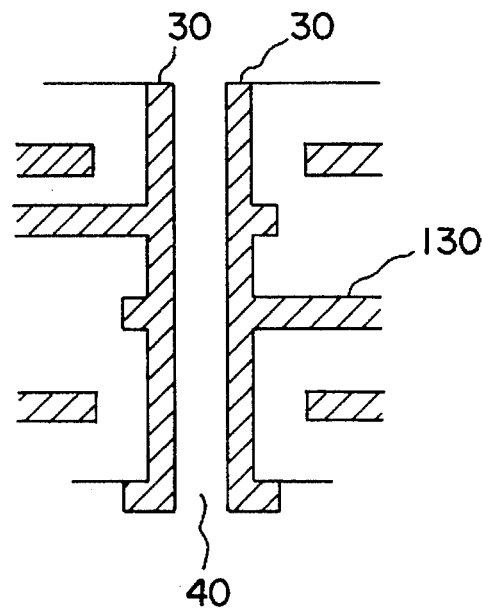

In step S140, the laser having a prescribed number, such as 500, of pulses is generated by the laser source 230, and is irradiated, via the mask 80 and the lens 90, onto the inner wall portion 30 of the through hole 40 in the printed-circuit board 10 mounted on the stage 100, as shown in FIG. 11B. This laser beam irradiation onto the inner wall portion 30 of the through hole 40 causes the conductive portion in the inner wall portion 30 to be volatilized and eliminated from the through hole 40, as shown in FIG. 11C. The laser beam irradiation onto the printed-circuit board 10 ends when the inner wall portion 30 of the whole through hole 40 has been removed from the through hole 40.

Consequently, in step S150, the width of the laser beam irradiated onto the printed-circuit board 10 is enlarged so as to eliminate the melted powder left on the printed-circuit board 10. The melted powder is produced by the volatilization and the removal of both the outer land 20 and the inner wall portion 30 of the through hole 40. This enlargement of the beam width is achieved by enlarging the size of the opening 82 of the mask 80. The enlargement of the width of the laser beam are also achieved by moving the lens 90 in the opposite direction of the printed-circuit board 10, or moving a z-axis movable table of the stage 100 in the opposite direction of the lens 90.

Figure 11C:
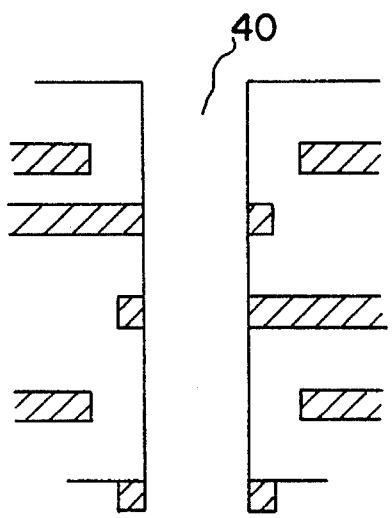

In step S160, the laser having a prescribed number, such as 10, of pulses is generated by the laser source 230, and is irradiated, via the mask 80 and the lens 90, onto the through hole 40 and its surroundings in the printed-circuit board 10 mounted on the stage 100, as shown in FIG. 11C. This laser beam irradiation causes the melted powder attached to the through hole 40 and its surroundings to be volatilized and removed from the printed-circuit board 10. Then the whole process for breaking the conducting path 130 formed in the printed-circuit board 10 is completed.

Next a description will be given, with reference to FIGS. 12 through 20, of a general operation of a laser system for breaking a conducting path according to a third embodiment of the present invention. A flow chart of the operation of the process computer 210 in the laser system is shown in FIG. 12.

First, in step S200, the printed-circuit board 10 is mounted on the stage 100 in the laser system.

Figure 13:
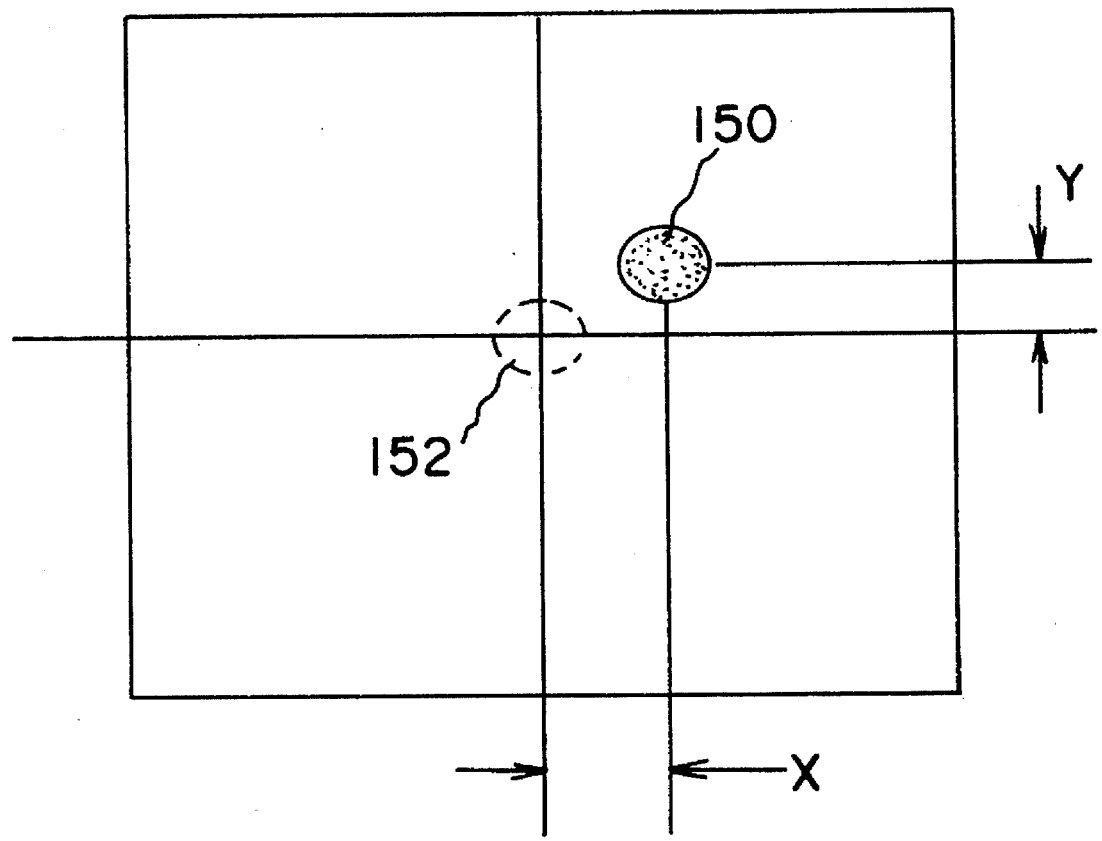
FIG. 13 is a schematic diagram for explaining a correction of a position of the printed-circuit board in the third embodiment according to the present invention.

In step S210, the process computer 210 sends a start command to the image processor 250, so that the image processor 250 takes an image of the printed-circuit board 10, as shown in FIG. 13. The image is taken with the camera 240 such as a CCD camera. A black colored mark 150 illustrated in FIG. 13 indicates a positioning mark 150 of the printed-circuit board 10 and can be detected by the image processor 250 with the image processing functions such as the binary image technique. Then, the image processor 250 detects the position of the mark 150, measures differences of x and y coordinates, or displacements of x and y coordinates, respectively, between the mark 150 and a prescribed reference position 152, illustrated in FIG. 13 with a broken-line circle. Then the image processor 250 sends resultant differences to the process computer 210. After receiving the resultant differences between the actual position 150 and the prescribed reference position 152, the process computer 210, for example, sends a command to the stage 100 so as to drive the stage 100 in order to correct such differences corresponding to the positioning error for the printed-circuit board 10.

In step S220, the process computer 210 determines a target portion to be broken on the printed-circuit board 10 in accordance with the data for processing reported from the host computer 200. Also the process computer 220 sends the command for driving the stage 100 to the stage 100 so that the target portion to be broken could be located within an available region where the laser system can operate.

Figure 14:
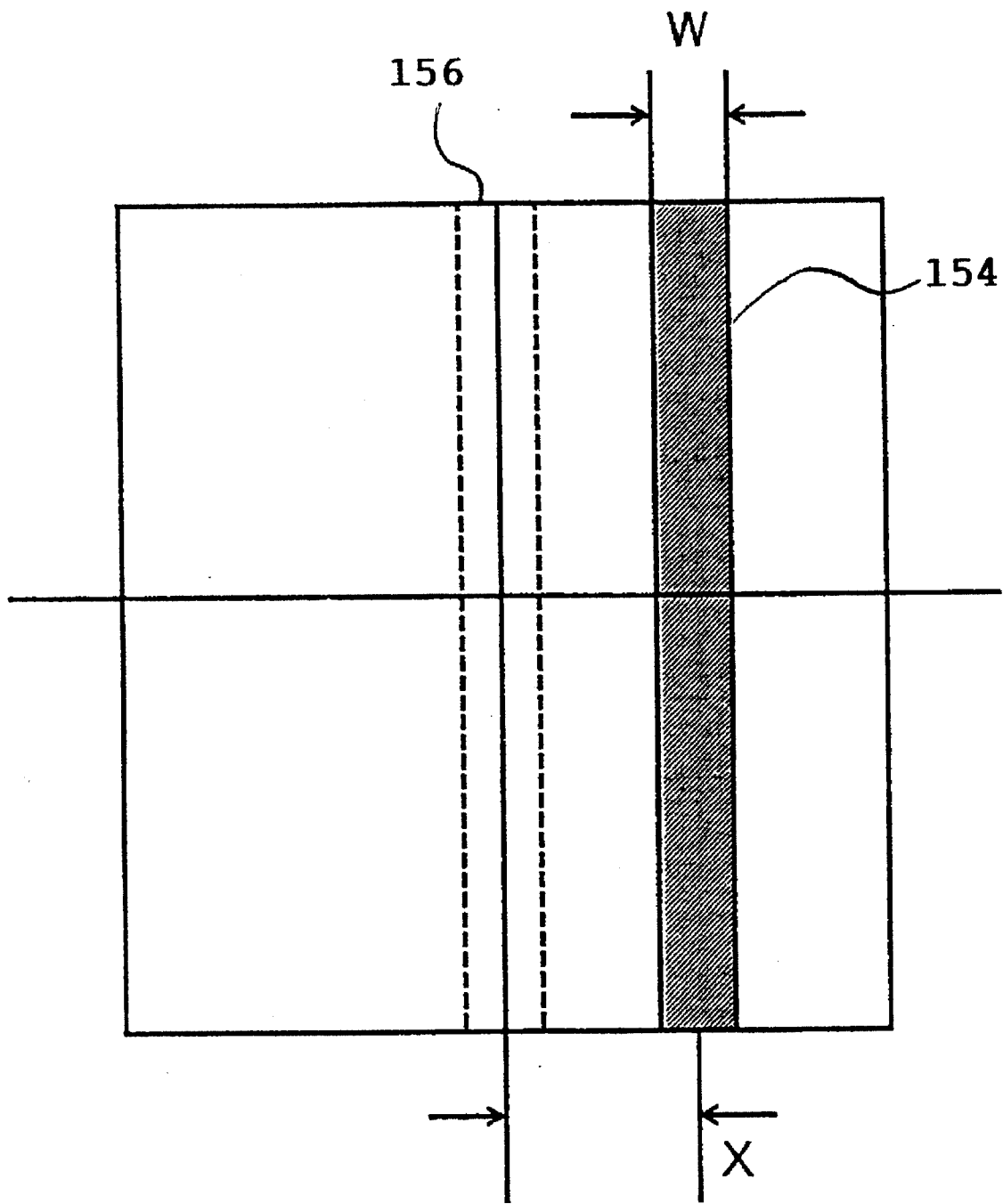
FIG. 14 is a schematic diagram for explaining an inspection of a broken portion of the conducting path in the third embodiment according to the present invention.

In step S230, the process computer 210 sends a command to the image processor 250 for taking an image of the conducting path 154 to be broken and its surroundings with the camera 240. The image of the conducting path 154 to be broken, which is processed by the image processor 250, is illustrated in FIG. 14. As shown in FIG. 14, a position and a width W of the conducting path 154 to be broken can be detected by the image processor 250. Then the image processor 250 measures a positioning difference X between the position of the detected conducting path 154 and a prescribed position of a conducting path 156 to be located. Then the image processor 250 sends the width W of the conducting path 154 to be broken and the positioning difference X to the process computer 210. After receiving the width W and the positioning difference X, the process computer 210 computes a distance to move the stage 100 and sends a command for moving the stage 100 with the computed distance to the stage 100, so that the conducting path 154 to be broken is located at a desirable position which has the prescribed position.

Figure 15:
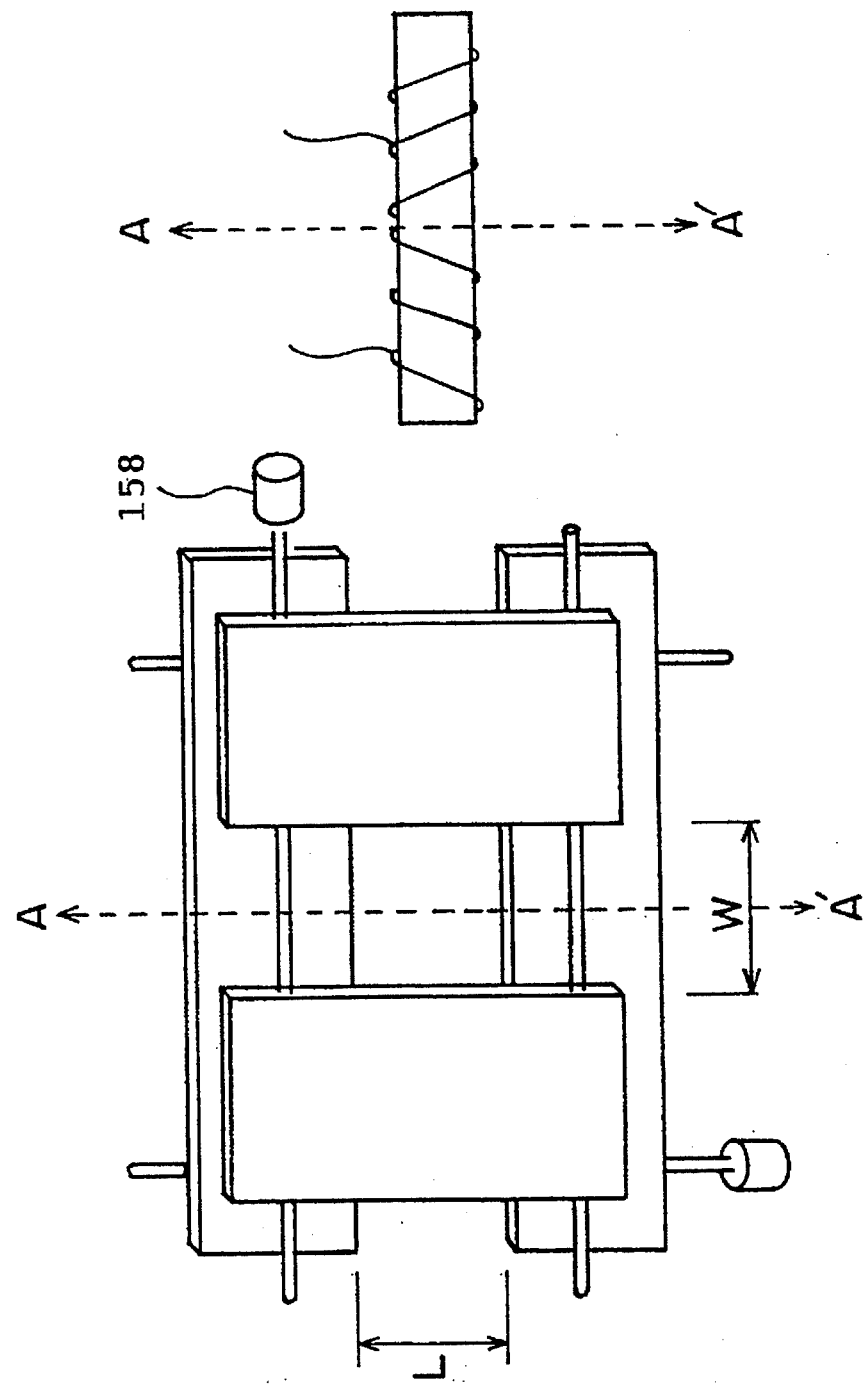
FIG. 15 is a schematic diagram showing a structure for adjusting a shape of an opening of a mask in the third embodiment according to the present invention.
Figure 16:
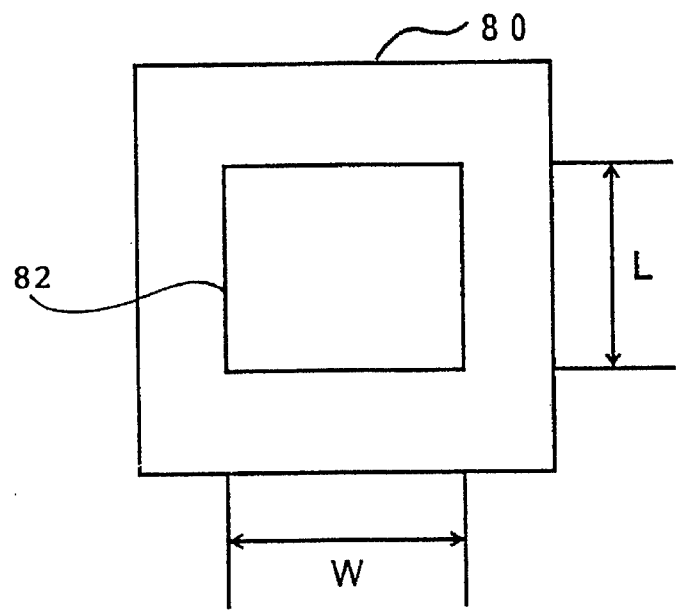
FIG. 16 is a schematic plan view showing the mask for explaining an adjustment of the shape of the opening of the mask in the third embodiment according to the present invention.

In step S240, the process computer 210 changes the size of the opening 82 of the mask 80 for masking a part of the printed-circuit board 10 in accordance with the data for processing from the host computer 200. An exemplary mechanical structure for adjusting the size of the opening 82 of the mask 80 is shown in FIG. 15. With this mechanical structure, a width W in one direction and a length L in another direction perpendicular to the one direction can be adjusted by a driving motor 158. FIG. 16 shows the opening 82 of the mask 80, wherein the size of the opening 82 is adjusted by the mechanical structure shown in FIG. 15. The process computer 210 computes the width W and the length L of the opening 82 of the mask 80 in accordance with the data for processing, and controls the drive motor so as to change the size of the opening 82 of the mask 80 to the computed width and length.

Figure 17:
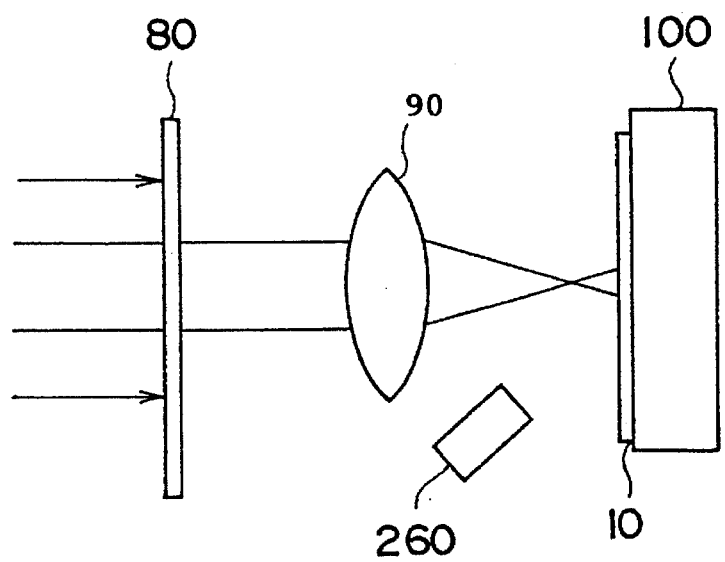
FIG. 17 is a schematic side view showing an arrangement of an optical displacement sensor in the third embodiment according to the present invention.

In step S250, the process computer 210 starts the displacement sensor 260 for measuring the quantity of the bending of the printed-circuit board 10 mounted on the stage 100. For example, the displacement sensor 260 can be an optical displacement sensor which is schematically illustrated in FIG. 17. As shown in FIG. 17, it is desirable that the displacement sensor 260 be located at an appropriate position so that the bending of the printed-circuit board 10 can be inspected by the displacement sensor 260 and also the laser beam irradiated onto the printed-circuit board 10 does not come across the displacement sensor 260. Locating the displacement sensor 260 in the appropriate position improves an accuracy of the displacement sensor 260 and effective laser beam irradiation. Further, with this displacement sensor 260, the bending of the printed-circuit board 10 can be detected during the laser beam irradiation.

In step S260, the conducting path 154 is broken at a broken portion by irradiating the laser beam onto the broken portion in the conducting path 154.

Figure 18:
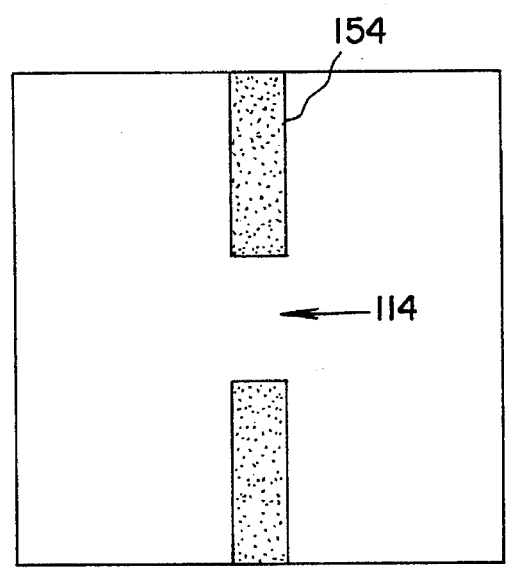
FIG. 18 is a schematic plan view for explaining a process for detecting an end of breaking the conducting path.

In step S270, the process computer 210 allows the image processor 250 to take an image of the broken portion, irradiated with the laser beam in step 260 as described above, with the camera 240. The image, processed by the image processor 250, of the broken portion 114 in the conducting path 154 is illustrated in FIG. 18. As shown in FIG. 18, after irradiating the laser beam onto the conducting path 154 on the printed-circuit board 10, the conducting path 154 is separated into two portions with the broken portion 114. At the broken portion 114, the conductive material is removed from the path. The image processor 250, for example, may measure a length of the broken portion along the conducting path 154 and sends the measured length to the process computer 210 for further processing.

In step S280, the process computer 210 determines, on the basis of the measured length from the image processor 250, whether the conducting path 154 has been broken successfully enough to satisfy requirements of the data for processing. If the length does not satisfy the requirements, the process computer 210 proceeds again to step S260 for further irradiating the laser beam onto the conducting path 154. While if the length satisfies the requirements, the process computer 210 proceeds to next step S290.

Figure 19A:
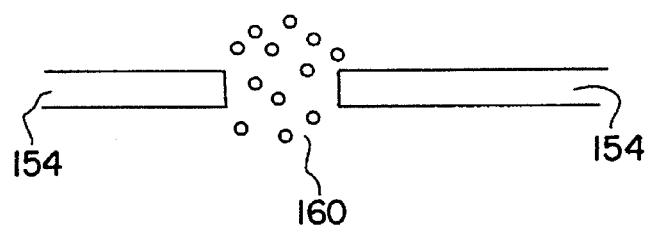
FIGS. 19A, 19B and 19C respectively are schematic plan views for explaining a cleaning process with a laser beam in the third embodiment according to the present invention.
Figure 19B:
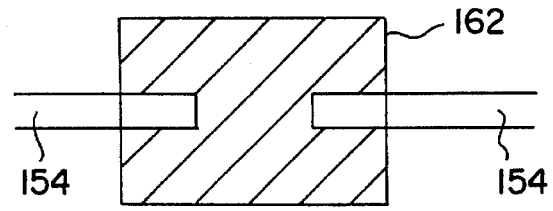
Figure 19C:
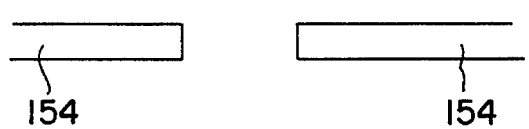

In step S290, after the breaking process has been completed, the process computer 210, for example, may allow the laser beam to be irradiated onto the broken portion 114 and its surrounding area to volatilize and eliminate the melted powder of the conductive material from the printed-circuit board 10 so that the melted powder is cleaned from the broken portion 114 and the surrounding area. In FIGS. 19A through 19C, a process for cleaning the melted powder from the printed-circuit board 10 is shown. As shown in FIG. 19A, when the conductive portion has been removed from the printed-circuit board 10, there remains the melted powder around the broken portion 114. Then, as shown in FIG. 19B, the process computer 210 allows the laser having a few pulses to be irradiated onto the broken portion 114 and the surrounding area broadly enough to cover a whole area 162 where the melted powder is distributed. Thus, as shown in FIG. 19C, the melted powder can be volatilized and eliminated from the printed-circuit board 10.

Figure 20:
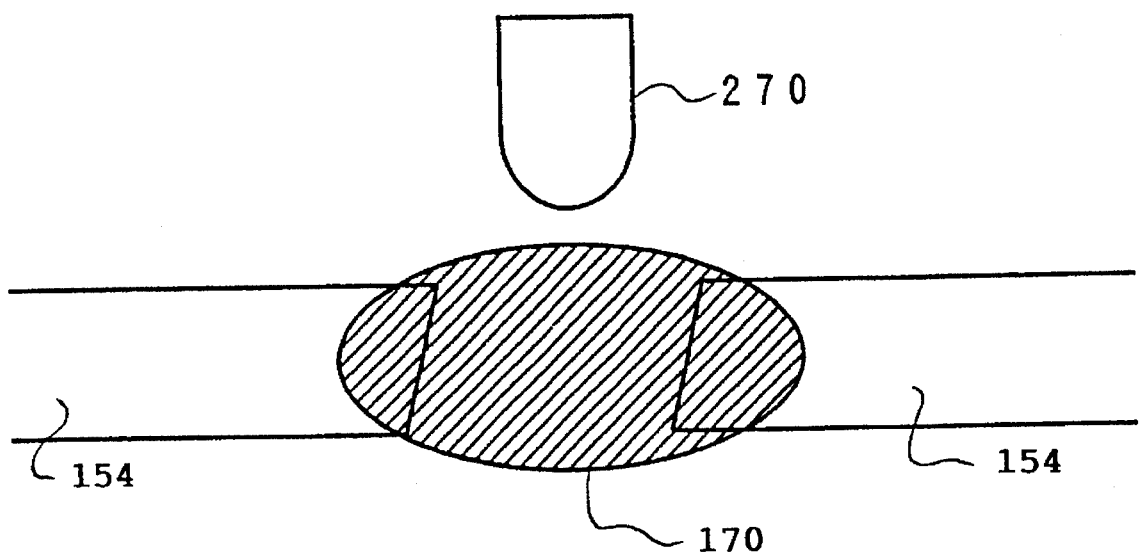
FIG. 20 is a schematic perspective view for explaining a process for applying a UV resin to the printed-circuit board in the third embodiment according to the present invention.

In step S300, the process computer 210 starts the UV-resin dispenser 270 for coating with the resin the printed-circuit board 10 to be protected against being damaged. FIG. 20 shows an exemplary embodiment for covering the printed-circuit board 10 with the resin 170 using the UV-resin dispenser 270. After covering the printed-circuit board 10 with the resin, in step S310, the UV-resin dispenser 270 exposes UV onto the area 162 covered with the resin.

Further, the present invention is not limited to the above-described embodiments, and variations and modifications may be made without departing from the scope of the present invention.

What is claimed is:

1. A method for breaking a conducting path formed on or in a printed-circuit board, comprising the steps of:
    a) arranging a laser source and said printed circuit board; and
    b) irradiating a laser beam a first time from the laser source onto a part of said conducting path so as to remove said part of said conducting path from said printed-circuit board, and irradiating the laser beam a second time to eliminate residue from said first time irradiation.

2. A method for breaking a conducting path formed on or in a printed-circuit board, comprising the steps of:
    a) arranging a laser source and said printed circuit board;
    b) irradiating a laser beam from the laser source onto a part of said conducting path so as to remove said part of said conducting path from said printed-circuit board; and
    c) irradiating the laser beam onto an inner wall portion inside of a through hole provided in said printed-circuit board and attached with a conductor so as to remove said inner wall portion from said through hole, wherein said inner wall portion inside of said through hole is a part of said conducting path.

3. The method as claimed in claim 2, further comprising the steps of:
    d) before c) irradiating the laser beam onto an outer land covering a land around an opening of said through hole on said printed-circuit board so as to remove said outer land from said printed-circuit board, wherein said outer land is a part of said conducting path; and
    e) after c) enlarging a width of the laser beam and irradiating the laser beam onto melted powder of the portions removed in said c) and said d) so as to eliminate said melted powder from said printed-circuit board.

4. The method as claimed in claim 2, wherein said c) further comprises the step of irradiating the laser beam circularly onto said inner wall portion inside of said through hole in said printed-circuit board so as to remove said inner wall portion circularly from said printed-circuit board.

5. A method for breaking a conducting path formed on or in a printed-circuit board, comprising the steps of:
    a) arranging a laser source and said printed circuit board; and
    b) irradiating a laser beam from the laser source onto a part of said conducting path so as to remove said part of said conducting path from said printed-circuit board; and
    wherein step b) further comprises the step of irradiating the laser beam onto a contacting portion formed from a part of a wiring pattern and a part of a land around an opening of a through hole in said printed-circuit board so as to remove said contacting portion from said printed-circuit board, wherein said wiring pattern and said land are part of said conducting path.

6. A method for breaking a conducting path formed on or in a printed-circuit board, comprising the steps of:
    a) arranging a laser source and said printed circuit board; and
    b) irradiating a laser beam from the laser source onto a part of said conducting path so as to remove said part of said conducting path from said printed-circuit board; and
    wherein step b) further comprises the steps of:
    c) defining a shape of an opening of a mask according to a shape of said conducting path to be broken, wherein said opening of said mask defines a region onto which the laser beam should be irradiated; and
    d) irradiating the laser beam onto at least a part of said conducting path through said opening of said mask so as to remove said part of said conducting path.

7. The method as claimed in claim 6, wherein said c) further comprises the step of:
    e) defining said shape of said opening of said mask according to a shape of a contacting portion formed from a part of a wiring pattern and a part of a land around an opening of a through hole in said printed-circuit board, wherein said wiring pattern and said land are parts of said conducting path; and
    the method further comprises the step of enlarging a width of the laser beam and irradiating the laser beam onto melted powder of said parts of said conducting path removed in d) so as to eliminate said melted powder on said printed-circuit board.

8. The method as claimed in claim 7, wherein said e) comprises the step of defining said shape of said opening of said mask semicircularly so as to remove semicircularly said contacting portion where said wiring pattern contacts with said land from said printed-circuit board.

9. A system for breaking a conducting path formed on or in a printed-circuit board comprising:

- a laser source for generating a laser beam;
- a lens for converging the laser beam generated by said laser source onto said conducting path; and
- a stage on which said printed-circuit board is mounted, wherein the laser beam is irradiated through said lens onto said conducting path on said printed-circuit board mounted on said stage; and
- a mask having an opening defining a region on or in said printed-circuit board, wherein the laser beam should be irradiated onto the region according to a shape of said conducting path to be broken.

10. The system as claimed in claim 9, wherein said mask, said lens and said stage are arranged so that the following equation is satisfied:

$$1/u + 1/v = 1/f$$

where u is a distance between said mask and a center of said lens, v is a distance between said center of said lens and said printed-circuit board, and f is a focal length of said lens.

11. The system as claimed in claim 9, wherein said opening of said mask is rectangularly shaped.

12. The system as claimed in claim 9, wherein said opening of said mask is circularly shaped.

13. The system as claimed in claim 9, wherein said opening of said mask is semicircularly shaped.

* * * * *